US012382734B2

(12) United States Patent
Hsieh et al.

(10) Patent No.: US 12,382,734 B2

(45) Date of Patent: Aug. 5, 2025

(54) BACK SIDE ILLUMINATED IMAGE SENSOR DEVICE WITH SELECT DIELECTRIC LAYERS ON THE BACKSIDE AND METHODS OF FORMING THE SAME

(71) Applicant: Taiwan Semiconductor Manufacturing Company Limited, Hsinchu (TW)

(72) Inventors: Feng-Chien Hsieh, Pingtung (TW); Chia-Yen Hsu, Hsinchu (TW); Yun-Wei Cheng, Taipei (TW); Wei-Li Hu, Tainan (TW); Kuo-Cheng Lee, Tainan (TW); Hsin-Chi Chen, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/365,687

(22) Filed: Aug. 4, 2023

(65) Prior Publication Data

US 2024/0006458 A1 Jan. 4, 2024

Related U.S. Application Data

(62) Division of application No. 17/192,653, filed on Mar. 4, 2021.

(51) Int. Cl.
*H10F 39/00* (2025.01)
*H10F 77/30* (2025.01)

(52) U.S. Cl.
CPC ....... *H10F 39/024* (2025.01); *H10F 39/8053* (2025.01); *H10F 77/337* (2025.01)

(58) Field of Classification Search
CPC ......... H01L 27/14685; H01L 27/14621; H01L 31/02165
See application file for complete search history.

(56) References Cited

U.S. PATENT DOCUMENTS

| | | | |
|---|---|---|---|
| 9,935,146 | B1 | 4/2018 | Lee |
| 2004/0211884 | A1 | 10/2004 | Fang et al. |

(Continued)

FOREIGN PATENT DOCUMENTS

| | | | |
|---|---|---|---|
| CN | 101369556 | A | 2/2009 |
| CN | 101976674 | B | 2/2011 |

(Continued)

*Primary Examiner* — Matthew C Landau
*Assistant Examiner* — Sean Ayers Winters
(74) *Attorney, Agent, or Firm* — FOLEY & LARDNER LLP

(57) ABSTRACT

An image sensor device is disclosed which includes a semiconductor layer having a first surface and a second surface, where the second surface is opposite to the first surface. The device includes a conductive structure disposed over the first surface, with a dielectric layer disposed between the conductive structure and the first surface. The device includes a first dielectric layer disposed over the second surface of the semiconductor substrate. The device includes a second dielectric layer disposed over the first dielectric layer. The device includes a color filter layer disposed over the second dielectric layer. In some embodiments, the thickness, refractive index, or both of the first dielectric layer and the thickness, refractive index, or both of the second dielectric layer may be collectively determined to cause incident radiation passing through the first dielectric layer and the second dielectric layer and to the plurality of pixels to have destructive interference.

20 Claims, 13 Drawing Sheets

(56) References Cited

U.S. PATENT DOCUMENTS

| | | | | |
|---|---|---|---|---|
| 2006/0183265 | A1 | 8/2006 | Oh et al. | |
| 2006/0189062 | A1 | 8/2006 | Deng et al. | |
| 2007/0205439 | A1* | 9/2007 | Okita | H01L 27/14632 257/E27.134 |
| 2009/0065821 | A1 | 3/2009 | Lee | |
| 2009/0072282 | A1 | 3/2009 | Lee | |
| 2013/0264671 | A1* | 10/2013 | Yun | H01L 27/14627 257/E31.127 |
| 2016/0276394 | A1* | 9/2016 | Chou | H01L 27/14636 |
| 2018/0155782 | A1 | 6/2018 | Zhong | |
| 2019/0131327 | A1 | 5/2019 | Chou et al. | |
| 2019/0377109 | A1 | 12/2019 | Frey et al. | |
| 2019/0386054 | A1 | 12/2019 | Chuang et al. | |
| 2022/0285416 | A1 | 9/2022 | Hsieh et al. | |

FOREIGN PATENT DOCUMENTS

| | | | |
|---|---|---|---|
| CN | 102034836 | B | 4/2011 |
| CN | 102110695 | A | 6/2011 |
| TW | 202002260 | A | 1/2020 |

* cited by examiner

1100

| Material | n |
|---|---|
| SiO2 | 1.5384 |
| SiO | 1.7369 |
| MgO | 1.7455 |
| Al2O3 | 1.7935 |
| Yb2O3 | 1.9627 |
| ZnO | 2.0516 |
| Si3N4 | 2.0634 |
| Ta2O5 | 2.1587 |
| ZrO2 | 2.1788 |
| HfO2 | 2.1842 |
| TeO2 | 2.3212 |
| TiO2 | 2.7114 |

| Material | doping | n |
|---|---|---|
| SiO2 | CaF2 | 1.4 |
| | B | 1.5 |
| | Ba | 1.55 |
| | P | 1.6 |

First dielectric layer $$2t_1 = \frac{2m_1+1}{2}\left(\frac{\lambda}{n_1}\right)m_1$$

Second dielectric layer $$2t_2 = \left(\frac{\lambda}{n_2}\right)m_2$$

| | wavelength A | THK | m 1 | 2 | 3 | 4 | 5 | 6 | 7 | wavelength A | THK | m 1 | 2 | 3 | 4 | 5 | 6 | 7 |
|---|---|---|---|---|---|---|---|---|---|---|---|---|---|---|---|---|---|---|
| B | 4500 | min | 2250 | 3750 | 5250 | 6750 | 8250 | 9750 | 11250 | 4500 | min | 1500 | 3000 | 4500 | 6000 | 7500 | 9000 | 10500 |
| | 4750 | max | 2375 | 3958 | 5542 | 7125 | 8708 | 10292 | 11875 | 4750 | max | 1583 | 3167 | 4750 | 6333 | 7917 | 9500 | 11083 |
| G | 4950 | min | 2475 | 4125 | 5775 | 7425 | 9075 | 10725 | 12375 | 4950 | min | 1650 | 3300 | 4950 | 6600 | 8250 | 9900 | 11550 |
| | 5700 | max | 2850 | 4750 | 6650 | 8550 | 10450 | 12350 | 14250 | 5700 | max | 1900 | 3800 | 5700 | 7600 | 9500 | 11400 | 13300 |
| R | 6200 | min | 3100 | 5167 | 7233 | 9300 | 11367 | 13433 | 15500 | 6200 | min | 2067 | 4133 | 6200 | 8267 | 10333 | 12400 | 14467 |
| | 7500 | max | 3750 | 6250 | 8750 | 11250 | 13750 | 16250 | 18750 | 7500 | max | 2500 | 5000 | 7500 | 10000 | 12500 | 15000 | 17500 |
| IR-1 | 7510 | min | 3755 | 6258 | 8762 | 11266 | 13768 | 16272 | 18775 | 7510 | min | 2503 | 5007 | 7510 | 10013 | 12517 | 15020 | 17523 |
| | 9600 | max | 4800 | 8000 | 11200 | 14400 | 17600 | 20800 | 24000 | 9600 | max | 3200 | 6400 | 9600 | 12800 | 16000 | 19200 | 22400 |
| IR-2 | 9610 | min | 4805 | 8008 | 11212 | 14415 | 17618 | 20822 | 24025 | 9610 | min | 3203 | 6407 | 9610 | 12813 | 16017 | 19220 | 22423 |
| | 13100 | max | 6550 | 10917 | 15283 | 19650 | 24017 | 28383 | 32750 | 13100 | max | 4367 | 8733 | 13100 | 17467 | 21833 | 26200 | 30567 |
| IR-3 | 13110 | min | 6555 | 10925 | 15295 | 19665 | 24035 | 28405 | 32775 | 13110 | min | 4370 | 8740 | 13110 | 17480 | 21850 | 26220 | 30590 |
| | 15500 | max | 7750 | 12917 | 18083 | 23250 | 28417 | 33583 | 38750 | 15500 | max | 5167 | 10333 | 15500 | 20667 | 25833 | 31000 | 36167 |
| Medium IR | 15550 | min | 7775 | 12958 | 18142 | 23325 | 28508 | 33692 | 38875 | 15550 | min | 5183 | 10367 | 15550 | 20733 | 25917 | 31100 | 36283 |
| | 40000 | max | 20000 | 33333 | 46667 | 60000 | 73333 | 86667 | 100000 | 40000 | max | 13333 | 26667 | 40000 | 53333 | 66667 | 80000 | 93333 |
| Far IR | 40050 | min | 20025 | 33375 | 46725 | 60075 | 73425 | 86775 | 100125 | 40050 | min | 13350 | 26700 | 40050 | 53400 | 66750 | 80100 | 93450 |
| | 100000 | max | 50000 | 83333 | 116667 | 150000 | 183333 | 216667 | 250000 | 100000 | max | 33333 | 66667 | 100000 | 133333 | 166667 | 200000 | 233333 |

Fig. 14

BACK SIDE ILLUMINATED IMAGE SENSOR DEVICE WITH SELECT DIELECTRIC LAYERS ON THE BACKSIDE AND METHODS OF FORMING THE SAME

CROSS-REFERENCE TO RELATED APPLICATION

This application is a divisional of U.S. patent application Ser. No. 17/192,653, filed Mar. 4, 2021, and titled "BACK SIDE ILLUMINATED IMAGE SENSOR DEVICE WITH SELECT DIELECTRIC LAYERS ON THE BACKSIDE AND METHODS OF FORMING THE SAME," the entire disclosure of which is incorporated herein by reference for all purposes.

BACKGROUND

The present disclosure generally relates to semiconductor devices, and particularly to image sensor devices and method of forming the same.

Semiconductor image sensors are used to sense incoming visible or non-visible radiation, such as visible light, infrared light, etc. Complementary metal-oxide-semiconductor (CMOS) image sensors (CIS) and charge-coupled device (CCD) sensors are used in various applications, such as digital still cameras, mobile phones, tablets, goggles, etc. These image sensors utilize an array of pixels that absorb (e.g., sense) the incoming radiation and convert it into electrical signals. A front side illuminated (FSI) images sensor device is one example of image sensor devices. These FSI image sensor devices are operable to detect light from its front side. A back side illuminated (BSI) images sensor device is one example of image sensor devices. These BSI image sensor devices are operable to detect light from its backside.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11, 12 and 13 illustrate tables of materials and refractive indices for selection of a material for use as a first dielectric layer and a second dielectric layer, in accordance with some embodiments.

FIG. 14 illustrates a table of layer thicknesses of the first dielectric layer and the second dielectric layer correlated with incident light wavelength, in accordance with some embodiments.

DETAILED DESCRIPTION

Figure 1B:
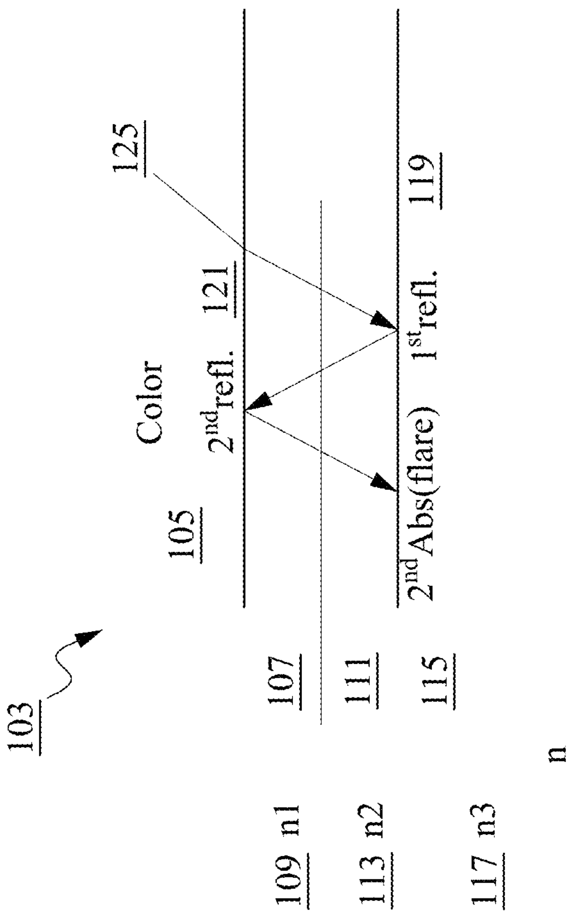
FIGS. 1A and 1B collectively illustrate the effect of additional tuning layers on the light wave travelling from the color filter layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about" and "substantially" can indicate a value of a given quantity that varies within 5% of the value (e.g., ±1%, ±2%, ±3%, ±4%, ±5% of the value).

Although the embodiment described below is focused on a back side illuminated image sensor (BSI), it should be understood that a front side illuminated image sensor (FSI) could also be formulated using the disclosed techniques.

In general, a back side illuminated (BSI) image sensor device includes a semiconductor substrate (e.g., silicon substrate) with pixels or radiation-sensing regions formed therein. As disclosed herein, the terms "radiation-sensing regions" and "pixels" may be used interchangeably. A BSI image sensor device can include a pixel array arranged within the semiconductor substrate. The pixel array is vertically arranged with respect to a multilevel metallization layer (e.g., one or more interconnect structures) formed on a first surface of the semiconductor substrate. The first surface of the semiconductor substrate is herein referred to as a "front side" or "front" surface of the semiconductor substrate. The pixel array extends into the semiconductor substrate and is configured to receive radiation (e.g., light) from or through a second surface of the semiconductor substrate opposite to the front surface of the semiconductor substrate. This second surface of the semiconductor substrate that receives the radiation (and is opposite to the front surface of the semiconductor substrate) is herein referred to as a "back side" or "back" surface of the semiconductor substrate.

The pixels in the semiconductor substrate are electrically isolated with isolation structures, such as deep trench isolation (DTI) structures. Aligned to the aforementioned isolation structures (and formed on the back surface of the semiconductor substrate) are respective grid structures that provide optical isolation between neighboring pixels. Adjacent grid structures collectively form cells. Further, the cells collectively form a composite grid structure configured to receive color filtering material. Based on the above description, the composite grid structure is formed on the back surface of the semiconductor substrate.

Color filtering material can be disposed between adjacent grid structures to form color filters. The color filtering material can be selected such that light with a desired wavelength passes through the filtering material, while light with other wavelengths is absorbed by the color filtering material. For example, a green light filtering material receiving unfiltered natural light would allow the green light portion (wavelengths between about 495 nm and about 570 nm) to pass through the filter, but would absorb all the other wavelengths. The color filters are aligned to respective pixels to provide filtered light to corresponding pixels.

The components of the BSI sensor device (e.g., pixels, transistors, capacitors, memory structures, other chips attached to the BSI sensor device, etc.) can be electrically coupled to external devices (e.g., an external circuitry) through wire connectors attached to pad structures formed on the back surface of the semiconductor substrate. To achieve this, the pad structures of a BSI sensor device physically extend from the back surface of the semiconductor substrate to the front surface of the semiconductor substrate and electrically connect to the multilevel metallization layer of the BSI sensor. Therefore, the multilevel metallization layer of the BSI sensor device, which provides electrical signal connection to the BSI sensor device, can be electrically coupled to an external device or circuit through the pad structures.

In existing technologies, wavelengths of light passing through the color filters and layers to the pixels are subject to constructive interference and other feedback noise, which results in petal flare and other defects. Petal flare may result in a visible artifact or a haze across the produced image. The artifact may obscure the image produced and may manifest as starbursts, rings, or circles across the image. The haze may result in reducing the contrast and lowering the color saturation resulting in a washed out image. Thus, the existing technologies of structures and fabrication of a BSI image sensor device are not entirely satisfactory.

The present disclosure provides various embodiments of a BSI image sensor device and methods of fabricating the same. The BSI image sensor device, as disclosed herein, includes one or more layers under the color filter layer. These layers can "tune" the light interference to remove petal flare, for instance by destructive interference of the light waves. In various embodiments, the destructive interference can be tuned by selection of the refractive index and thickness of one or more tuning layers. Accordingly, the disclosed BSI image sensor device can be characterized as having less petal flare issues, when compared to the existing BSI image sensor devices.

Figure 1A:
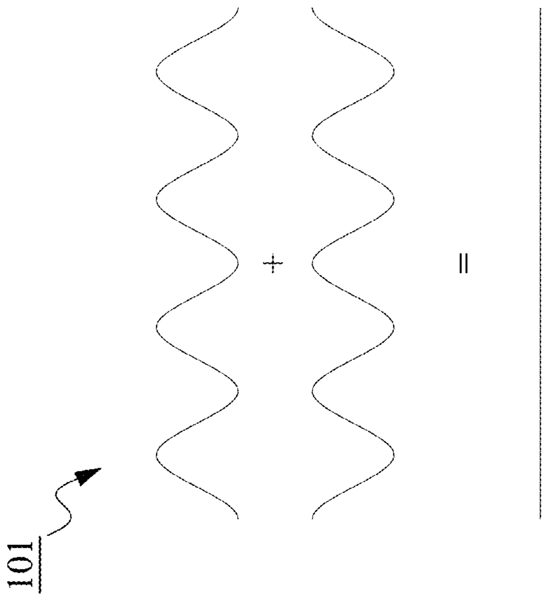

FIGS. 1A and 1B illustrate the effect of the light wave travelling across one embodiment, and collectively illustrate the effect of additional tuning layers on the light wave travelling from the color filter layer. As shown in the exemplary illustration of FIG. 1A, 101, layers can be used to create destructive interference and reduce noise. Waves of light can be tuned using the thickness and the refractive index of the material to create destructive inference between light waves as shown in FIG. 1B. For instance, a light wave 125 may pass through the color filter 105 into a first layer 107. The first layer 107 may have a first refractive index 109 which may alter the light wave 125. The light wave 125 may pass into a second layer 111 with a second refractive index 113 which may alter the light wave 125. The light wave may reflect on the surface below creating, for instance, a first reflection 119. The light wave 125 may pass through the second layer 111 and first layer 107, altering the light wave, and reflect on the surface above creating, for instance, a second reflection. The light wave 125 may pass again through the first layer 107 and second layer before it is detected. Unless properly tuned, such a process can create flare. When properly tuned, however, the flare can be removed using destructive interference as shown in FIG. 1A, 101. Additionally, the thickness of the layers and materials can be patterned and tuned across the wafer. This can be optimized to reduce noise such as petal flare.

Figure 2:
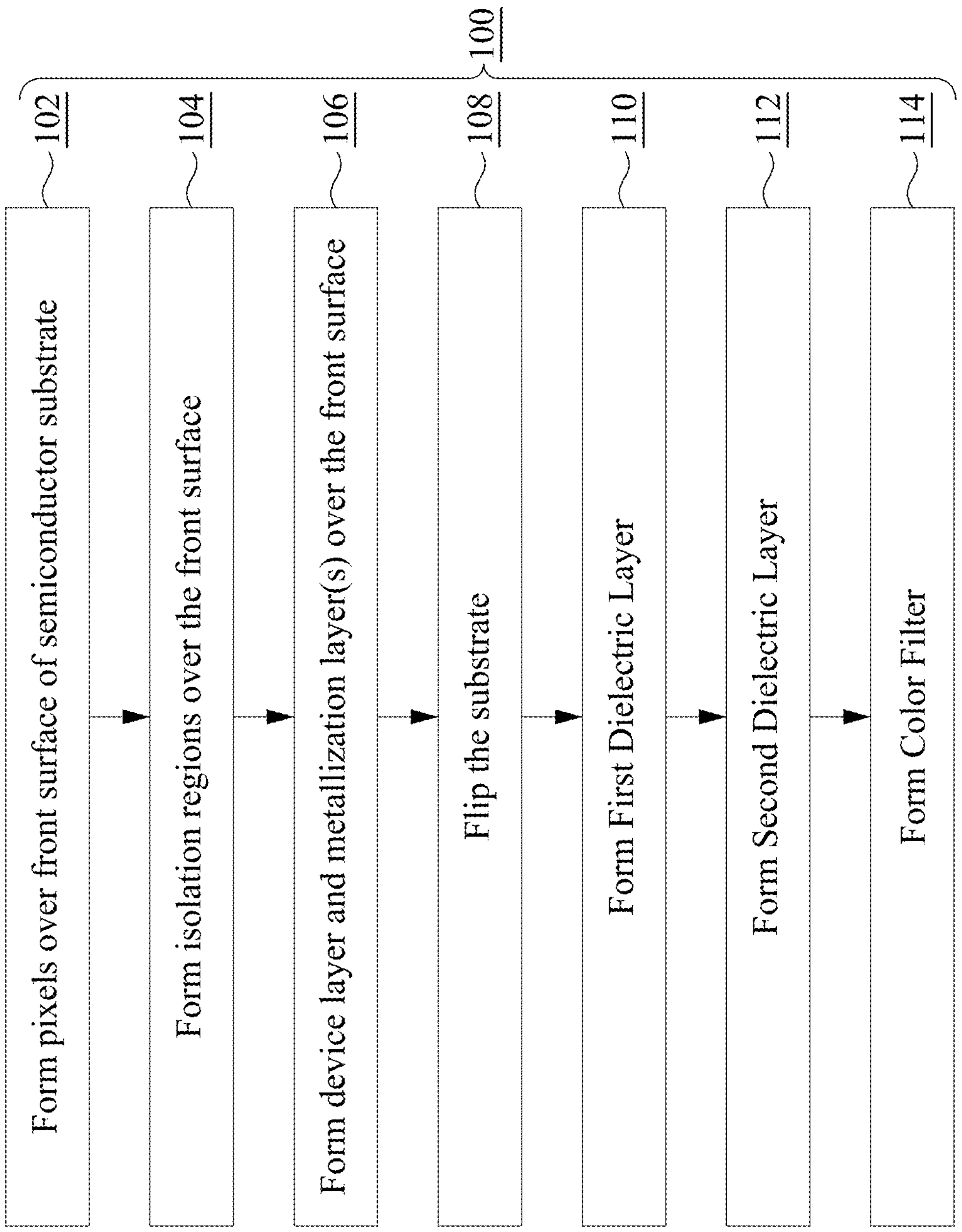
FIG. 2 illustrates a flow chart of an example method for making an image sensor device, in accordance with some embodiments.

FIG. 2 illustrates a flowchart of a method 100 to form a BSI image sensor device, according to one or more embodiments of the present disclosure. It is noted that the method 100 is merely an example, and is not intended to limit the present disclosure. It is also noted that other embodiments may not include all steps in method 100. For example, an FSI image sensor device, according to one or more embodiments of the present disclosure, would not include step 108, for example. Accordingly, it is understood that additional operations may be provided before, during, and after the method 100 of FIG. 2, and that some other operations may only be briefly described herein. In some embodiments, operations of the method 100 may be associated with cross-sectional views of a BSI image sensor device at various fabrication stages as shown in FIGS. 3, 4, 5, 6, 7, 8, 9, and 10, respectively, which will be discussed in further detail below.

In brief overview, the method 100 starts with operation 102 of forming a number of pixels (or radiation sensing regions) over the front surface of a semiconductor substrate. The method 100 continues to operation 104 of forming one or more isolation regions over the front surface. The method 100 continues to operation 106 of forming a device layer and one or more metallization layers over the front surface. The method 100 continues to operation 108 of flipping the semiconductor substrate. The method 100 continues to operation 110 of forming a first dielectric layer on a back surface of the semiconductor substrate. The method 100 continues to operation 112 forming a second dielectric layer on the back of the semiconductor substrate. The method 100 continues to operation 114 of forming a color filter layer on the back side of the semiconductor substrate.

As mentioned above, FIGS. 3-10 each illustrate, in a cross-sectional view, a portion of a BSI image sensor device 200 at various fabrication stages of the method 100 of FIG. 1. FIGS. 3-10 are simplified for a better understanding of the concepts of the present disclosure. Although the figures illustrate the BSI image sensor device 200, it is understood that the BSI image sensor device 200 may include a number of other devices such as inductors, fuses, capacitors, coils, etc., which are not shown in FIGS. 3-10, for purposes of clarity of illustration.

Figure 3:
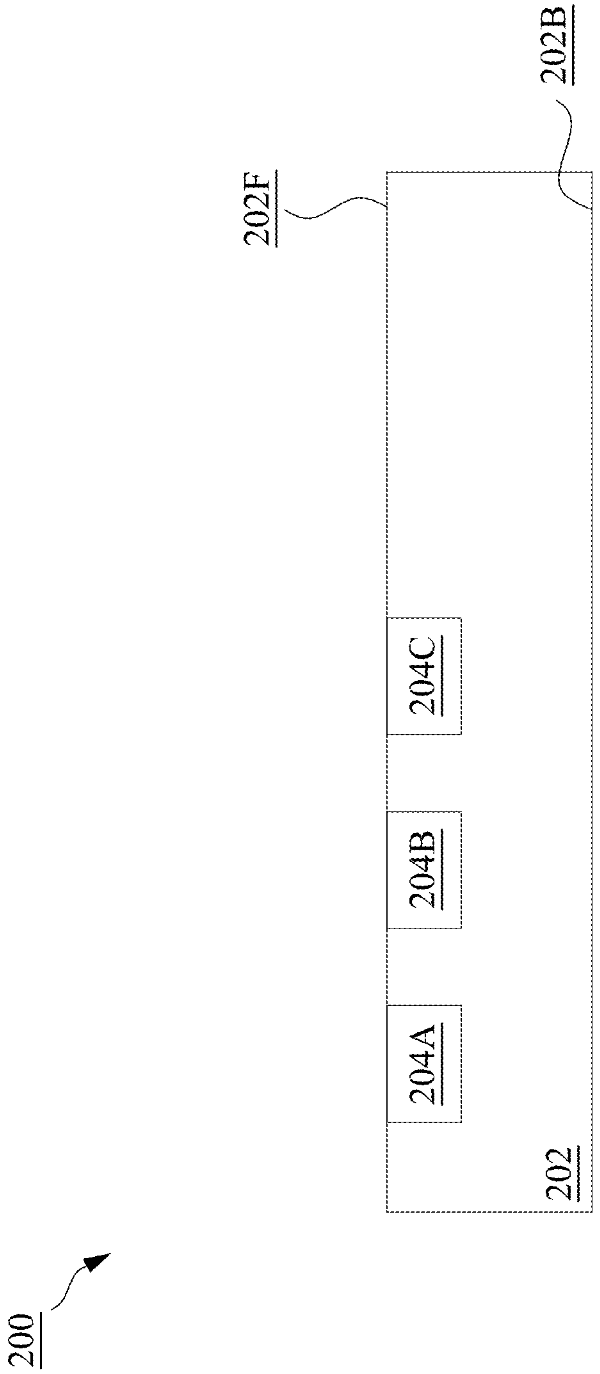
FIGS. 3, 4, 5, 6, 7, 8, 9, and 10 illustrate cross-sectional views of an example image sensor device during various fabrication stages, made by the method of FIG. 2, in accordance with some embodiments.

Corresponding to operation 102 of FIG. 2, FIG. 3 is a cross-sectional view of the BSI image sensor device 200 including a number of pixels, 204A, 204B, and 204C, formed over a front surface 202F of a semiconductor substrate (or semiconductor layer) 202 at one of the various stages of fabrication. Opposite to the front surface 202F (e.g., along the Z axis), the semiconductor substrate 202 has a back surface 202B, through which the BSI image sensor device 200 is configured to receive incident radiation.

The semiconductor substrate 202 can include a bulk semiconductor wafer or a top layer of a semiconductor on insulator wafer (SOI), with a thickness greater than about 6 μm (e.g., about 6.15 μm, about 6.30 μm, about 6.50 μm, or about 6.70 μm). For example, the semiconductor substrate 202 can include a semiconductor material such as silicon, germanium, a compound semiconductor, an alloy semiconductor, any other suitable semiconductor material, and/or combinations thereof. Further, the semiconductor substrate 202 can be an epitaxial material strained for performance enhancement and/or a doped with n-type dopants, p-type dopants, or combinations thereof. In various embodiments, the semiconductor substrate 202 can include combinations of p-type and n-type doped regions.

The pixels 204A-C are formed on the front surface of the semiconductor substrate 202F. Although three pixels 204A-C are shown in FIG. 3 and the following cross-sectional figures, it should be understood that the BSI image sensor device 200 can include any desired number of pixels while remaining within the scope of the present disclosure.

The pixels 204A-C are each configured to sense electromagnetic radiation, such as near infrared light. By way of example and not limitation, each of the pixels 204A-C includes a photodiode structure, such as a pinned layer photodiode, a photogate, a reset transistor, a source follower transistor, a transfer transistor, any other suitable structure, and/or combinations thereof. Further, the pixels 204A-C may sometimes be referred to as "radiation-detection devices" or "light-sensors." In some embodiments, the pixels 204A-C are formed by doping the semiconductor substrate 202 from the front surface 202F. For example, the doping process can include doping the semiconductor substrate 202 with a p-type dopant, such as boron, or an n-type dopant, such as phosphorous or arsenic. In some embodiments, the pixels 204A-C are formed by a dopant diffusion process and/or an ion implantation process.

Figure 4:
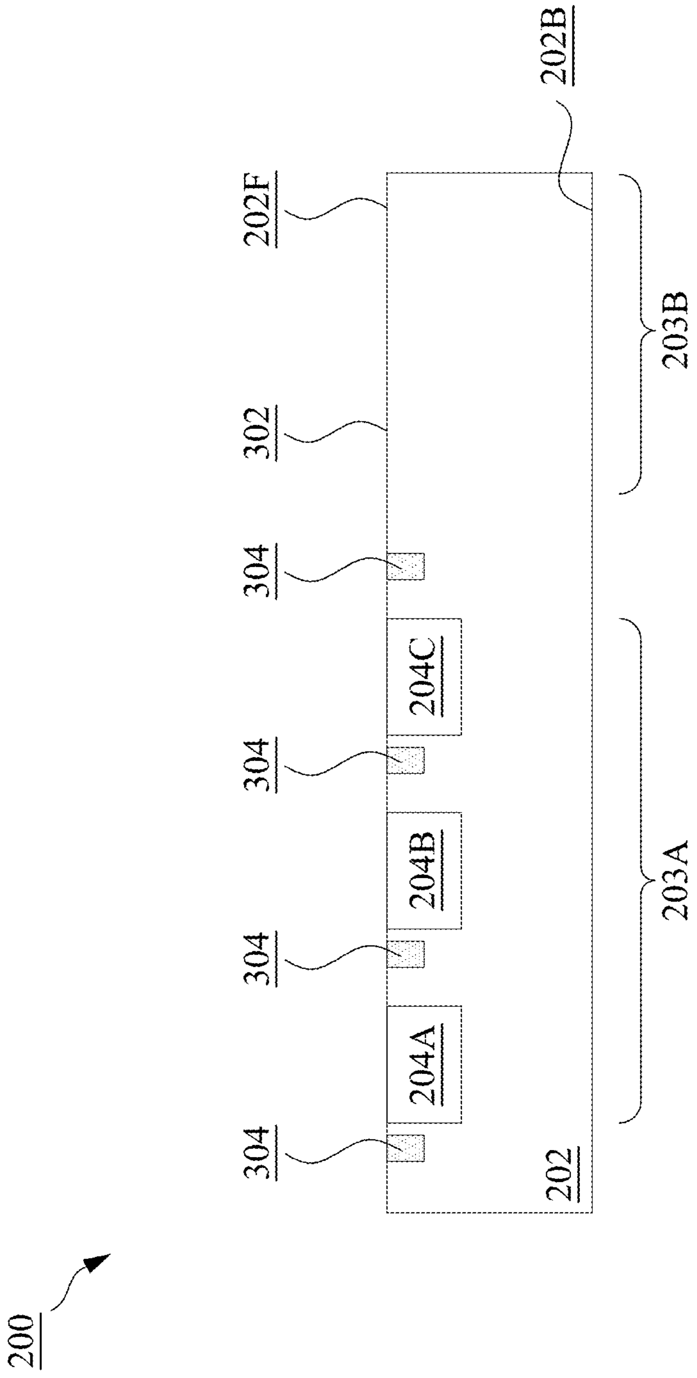

Corresponding to operation 104 of FIG. 2, FIG. 4 is a cross-sectional view of the BSI image sensor device 200 including one or more isolation regions, 304, formed over the front surface 202F at one of the various stages of fabrication. Such isolation regions 304 can isolate pixels 204A-C from each other. By way of example and not limitation, the isolation regions 304 can be formed over respective portions of the front surface 202F.

In some embodiments, the isolation regions 304 can be formed by performing at least some of the following processes: forming a patternable layer (e.g., a photoresist (PR) layer) with a pattern that defines respective locations of the isolation regions 304 in the semiconductor substrate 202; etching (e.g., dry etching) the semiconductor substrate 202 using the patternable layer as an etch mask to form recesses; removing (e.g., wet etching) the patternable layer; depositing one or more layers including, but not limited to, silicon oxide, USG, PSG, BPSG, PEOX, FSG, a low-k dielectric material (e.g., with a k value less than about 3.9), or combinations as a blanket layer to fill the recesses; and planarizing (e.g., a chemical-mechanical polishing (CMP) process) the blanket layer.

Figure 5:
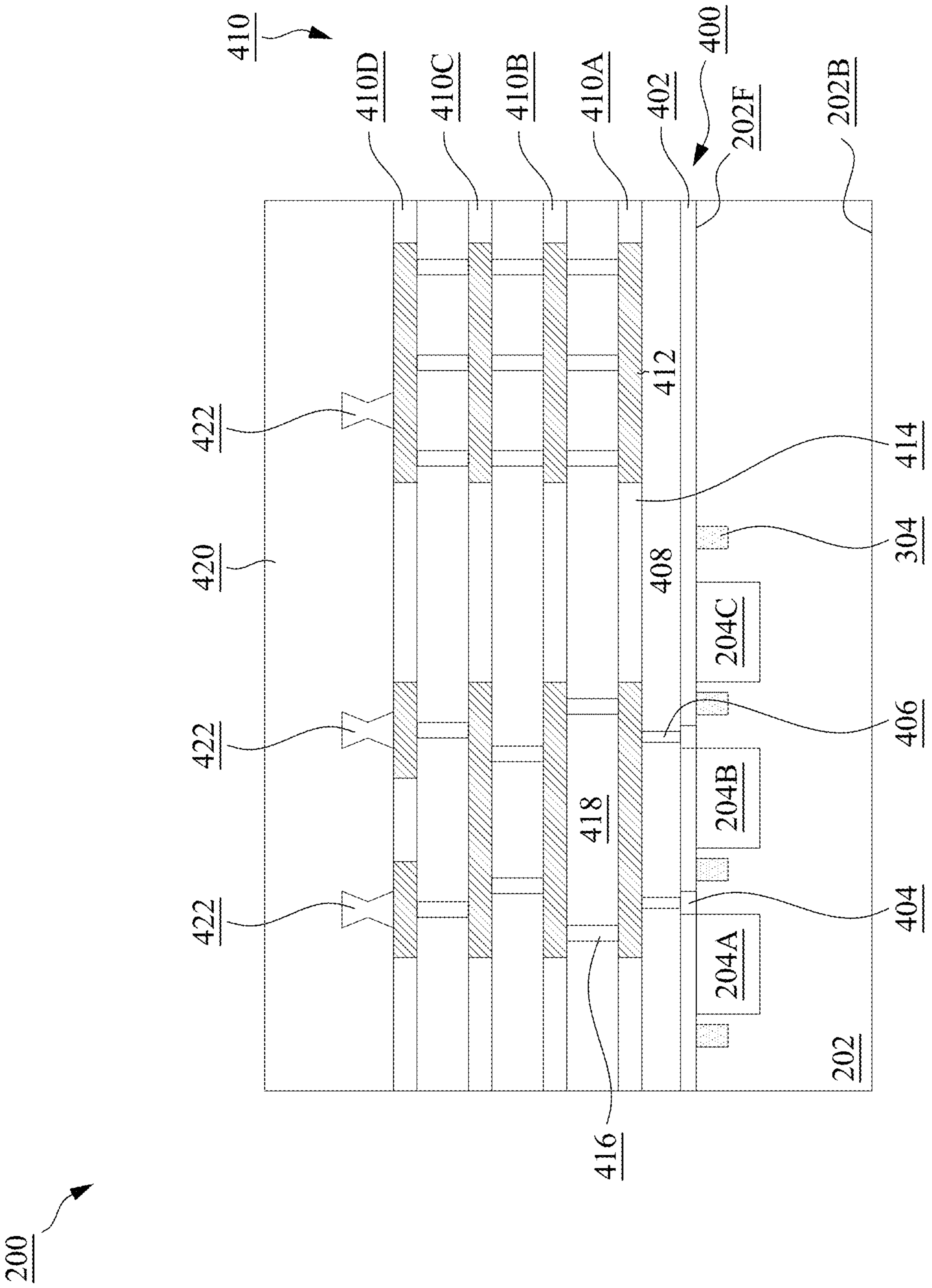

Corresponding to operation 106 of FIG. 2, FIG. 5 is a cross-sectional view of the semiconductor device 200 including a device layer 400 and one or more metallization layers 410 at one of the various stages of fabrication. The device layer 400 and metallization layers 410 can be sequentially formed on or above the front surface 202F of the semiconductor substrate 202, in accordance with some embodiments. For example, the device layer 400 may be in contact with a certain portion of the front surface 202F.

The device layer 400 can include one or more semiconductor devices 404 (e.g., field effect transistors) formed according to a chip layout on front surface 202F of the semiconductor substrate 202. The device layer 400 may also include additional elements or structures, such as doped regions, dummy regions, epitaxial layers, capacitor structures, resistors, etc. These additional elements or structures of the device layer 400 are not shown in FIG. 5 for simplicity. In some embodiments, the BSI image sensor device 200 includes vertical conductive structures 406 (e.g., vias) that electrically connect the semiconductor devices 404 and other elements of the device layer 400 to upper metallization layers. The conductive structures 406 can form a portion of a middle of the line (MOL) wiring network. In some embodiments, the device layer 400 further includes a nitride layer 402 that is used as an etch stop layer (ESL) in a subsequent etching operation during the formation of the pad structures. In some embodiments, the ESL 402 is formed around the semiconductor devices 404, but not between the semiconductor devices 404 and the semiconductor substrate 202. The ESL 402, semiconductor devices 404, and conductive structures 406 may be embedded or overlaid by a corresponding dielectric layer 408.

The metallization layers 410 can include one or more metallization layers, such as metallization layers 410A, 410B, 410C, and 410D, as shown in FIG. 5. It should be understood that the image sensor device 200 can include any desired number of metallization layers while remaining within the scope of the present disclosure. In some embodiments, along the Z axis, the metallization layer 410A is a first, or bottommost, metallization layer (sometimes referred to as "M1" layer) and the metallization layer 410D is a topmost metallization layer (sometimes referred to as "top metal (TM)" layer). The metallization layers 410 can form a portion of a back end of the line (BEOL) wiring network. Each of the metallization layers 410 (e.g., 410A-D) can include one or more lateral conductive structures 412 (e.g., lines) embedded in a corresponding dielectric layer 414. In some embodiments, one or more conductive structures and a dielectric layer in which the conductive structure(s) are embedded may sometimes be collectively referred to as a metallization layer.

Across different metallization layers 410, one or more vertical conductive structures 416 (e.g., vias) can be extended through a corresponding dielectric layer 418 to electrically connect adjacent metallization layers along the Z axis. The lines 412 and vias 416, formed of copper, for example, may sometimes be referred to as copper interconnect structures. Although not shown, in some embodiments, each of the copper lines 412 and copper vias 416 may be surrounded by a (diffusion) barrier layer. The barrier layer can include a material selected from a group consisting of: tantalum (Ta), tantalum nitride (TaN), titanium nitride (TiN), titanium tungsten (TiW), and titanium (Ti). In some embodiments, such a barrier layer may sometimes be referred to as a part of the corresponding metallization layer (or the corresponding conductive structure).

The dielectric layers 408, 414, and 418 can electrically isolate the elements and/or structures therein. In some embodiments, each of the dielectric layers 408, 414, and 418 is a portion of an interlayer dielectric (ILD) or inter-metal dielectric (IMD) layer. For example, such an ILD or IMD layer includes silicon oxide, USG, BPSG, a low-k dielectric (e.g., with a dielectric constant lower than 3.9), or a stack of dielectrics—such as a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; and/or (iv) a low-k dielectric (e.g., carbon doped silicon oxide) with silicon oxide.

In some other embodiments, the device layer 400 and/or the metallization layers 410 can be formed on a separate semiconductor substrate (e.g., different from the semiconductor substrate 202) and be subsequently attached to front surface 202F of the semiconductor substrate 202.

In certain applications of the image sensor device 200, an application specific integrated circuit (ASIC) and/or a silicon-on-chip (SoC) 420 can be attached to the top metallization layer 410D. Such a structure may sometimes be referred to as a three-dimensional (3D) stack, or 3D integrated circuit. In this regard, one or more bonding structures 422 can be used to electrically and mechanically bond the ASIC/SoC 420 to the top metallization layer 410D. The ASIC/SoC 420 can add functionality to the image sensor device 200 or may control functions of the image sensor device 200. In some embodiments, the ASIC/SoC 420 includes metallization layers, semiconductor devices, memory devices, or can be a stack of chips such as memory chips, central processing unit (CPU) chips, other functional chips (e.g., RF chips), or combinations thereof.

Figure 6:
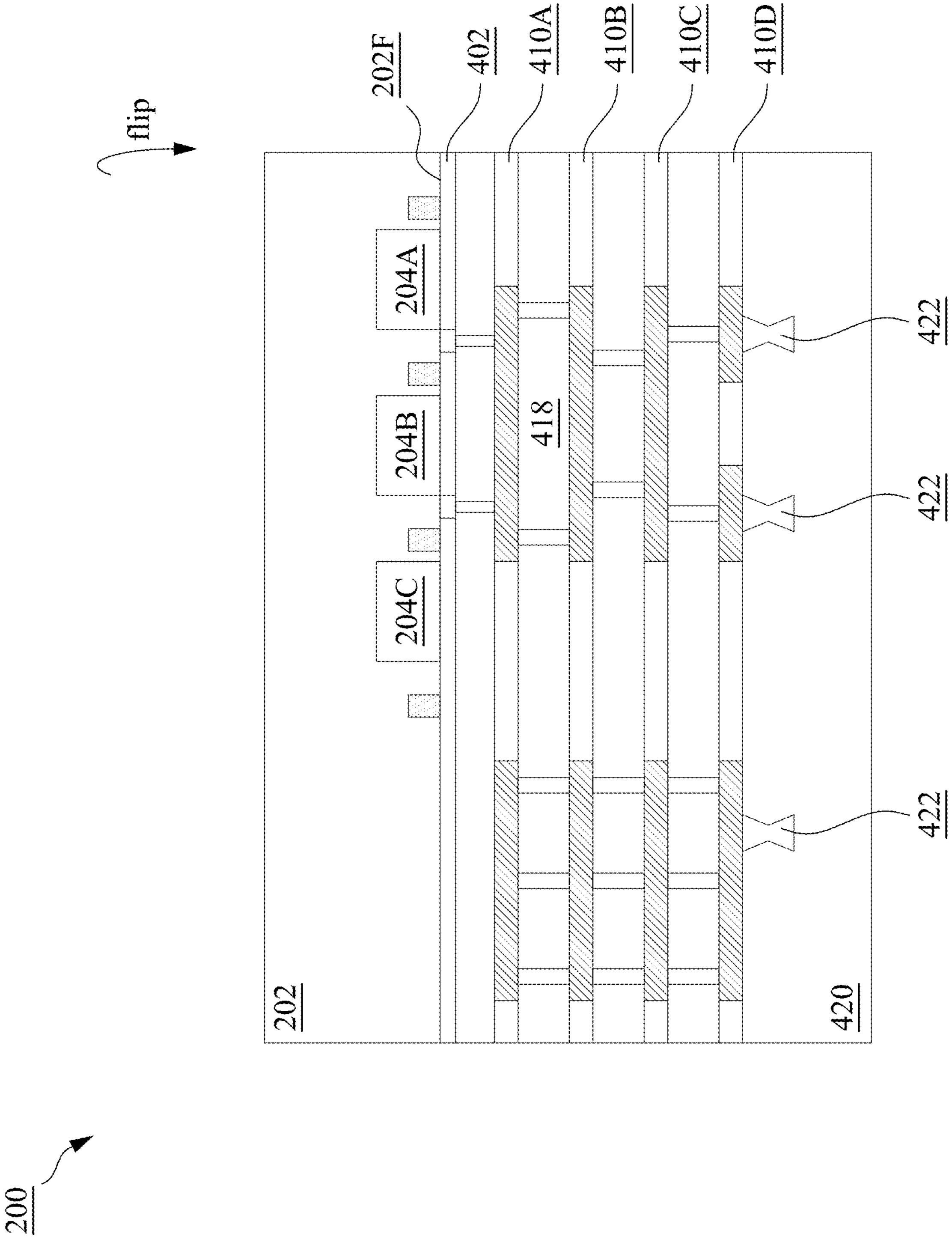
Figure 7:
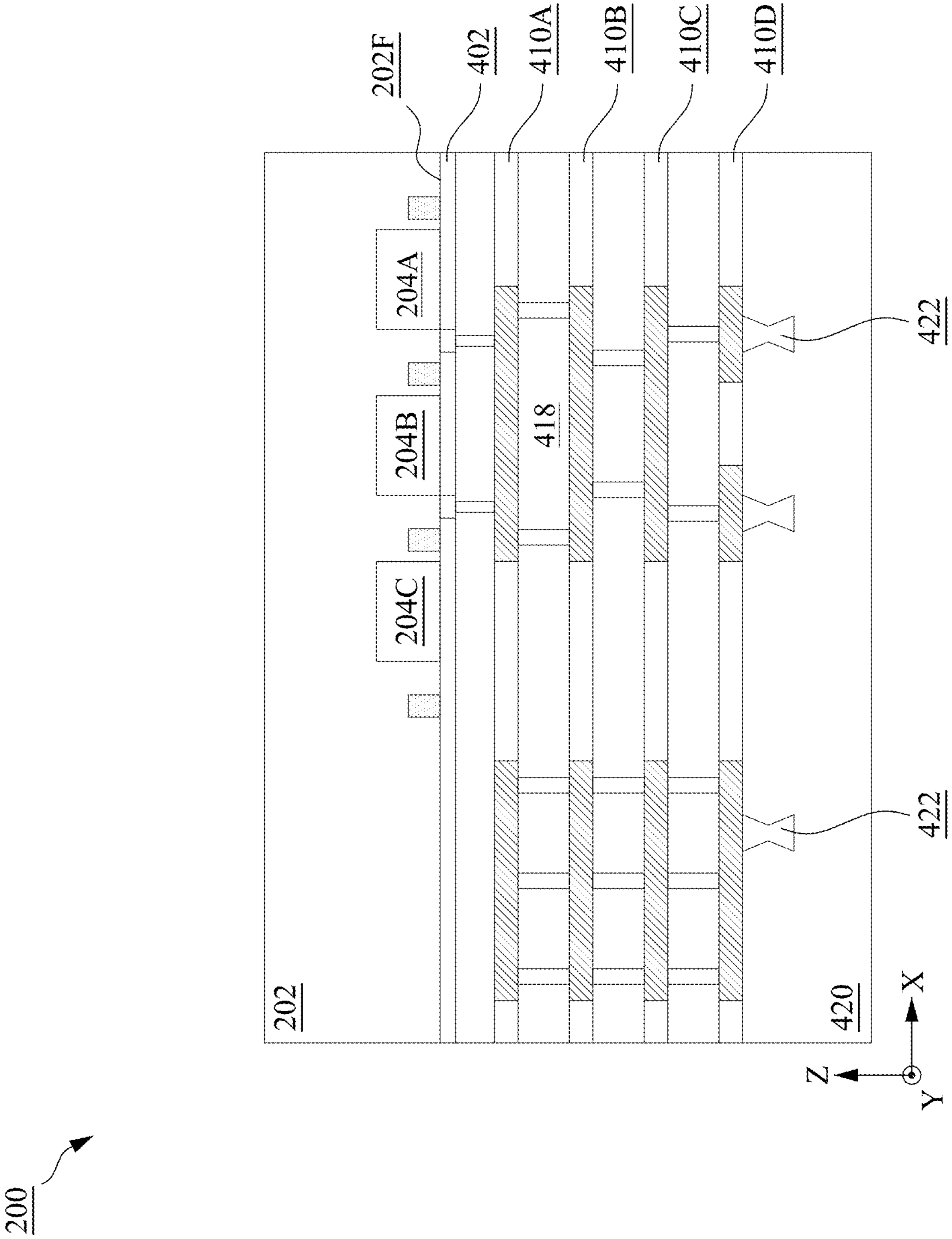

In accordance with some embodiments, fabrication of the BSI image sensor device 200 may continue with forming additional structures in or on the semiconductor substrate 202 from the back surface 202B. In this regard, such a partially-fabricated BSI image sensor 200 can be rotated 180° (flipped) around the X axis (as shown in FIG. 6), which also corresponds to operation 108 of FIG. 2.

The semiconductor substrate 202 may be thinned to a desired thickness Ti. Thinning may allow light waves to pass through the semiconductor substrate 202 to the pixels 204 A-C. By way of example and not limitation, thickness Ti can range from about 2 μm to about 6 μm, depending on the application of the BSI image sensor device 200. The thinning of semiconductor substrate 202 may be performed by a planarization process (e.g., a CMP process), an etch-back process (e.g., a dry etching process), some other thinning process (e.g., grinding), or a combination thereof.

Figure 8:
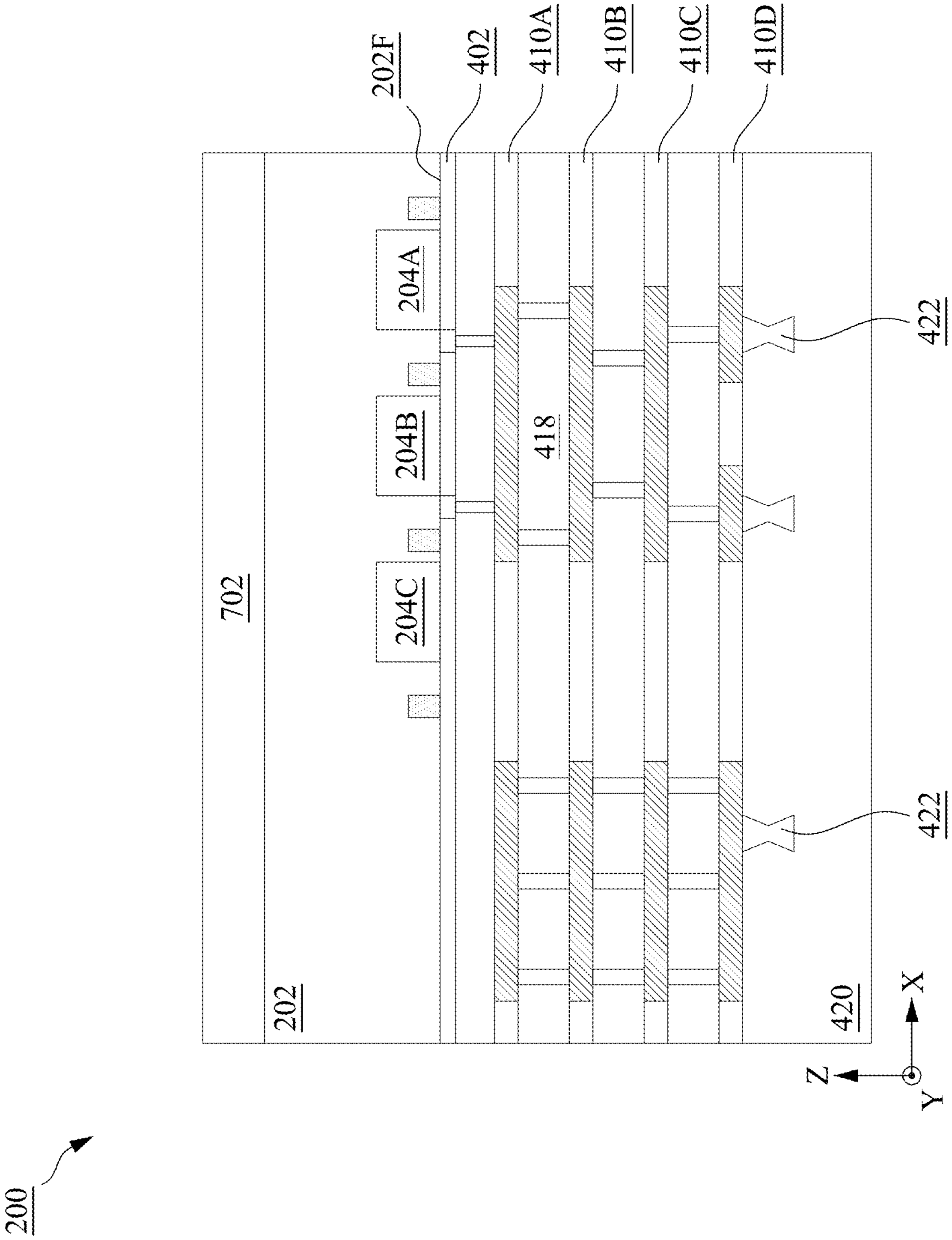

Corresponding to operation 110 of FIG. 2, FIG. 8 is a cross-sectional view of the BSI image sensor device 200 including a first dielectric layer 702 at one of the various stages of fabrication. The first dielectric layer 702 may be deposited over the back side 202B of the substrate 202. The first dielectric layer 702 may be a single layer or a multi-layered structure. In some embodiments, the first dielectric layer 702 is silicon oxide, carbon-doped silicon oxide, a comparatively low dielectric constant (k value) dielectric material with a k value less than about 4.0, or combinations thereof. In some embodiments, the first dielectric layer 702 is formed of a material, including low-k dielectric material, extreme low-k dielectric material, porous low-k dielectric material, and combinations thereof. A wide variety of materials may be employed in accordance with embodiments, for example, lower dielectric constant materials composed of Si, O, X, N in oxide, nitride, or carbide composite films. Examples of possible second dielectric layer 802 materials include $SiO_2$, SiO, MgO, $Al_2O_3$, $Yb_2O_3$, ZNO, $Si_3N_4$, $Ta_2O_5$, $ZrO_2$, $HFO_2$, $TeO_2$, $TiO_2$. Other examples of possible second dielectric layer 802 materials include $SiO_2$ doped with one or more of $CaF_2$, B, Ba, and P. Other examples of possible second dielectric layer 802 materials are various forms of $Si_xO_yN_z$.

Examples of possible embodiments may include spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the first dielectric layer 702 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer. The thickness of the first dielectric layer 702 may be patterned across the substrate. In some embodiments, the thickness of the first dielectric layer 702 may be selected to cause incident radiation passing through a color filter layer (e.g., 902 of FIG. 10), the first dielectric layer 702 and the second dielectric layer 802 to the pixels 204A-C to have destructive interference. In some embodiments, the first dielectric layer 702 may be an oxide layer.

Figure 9:
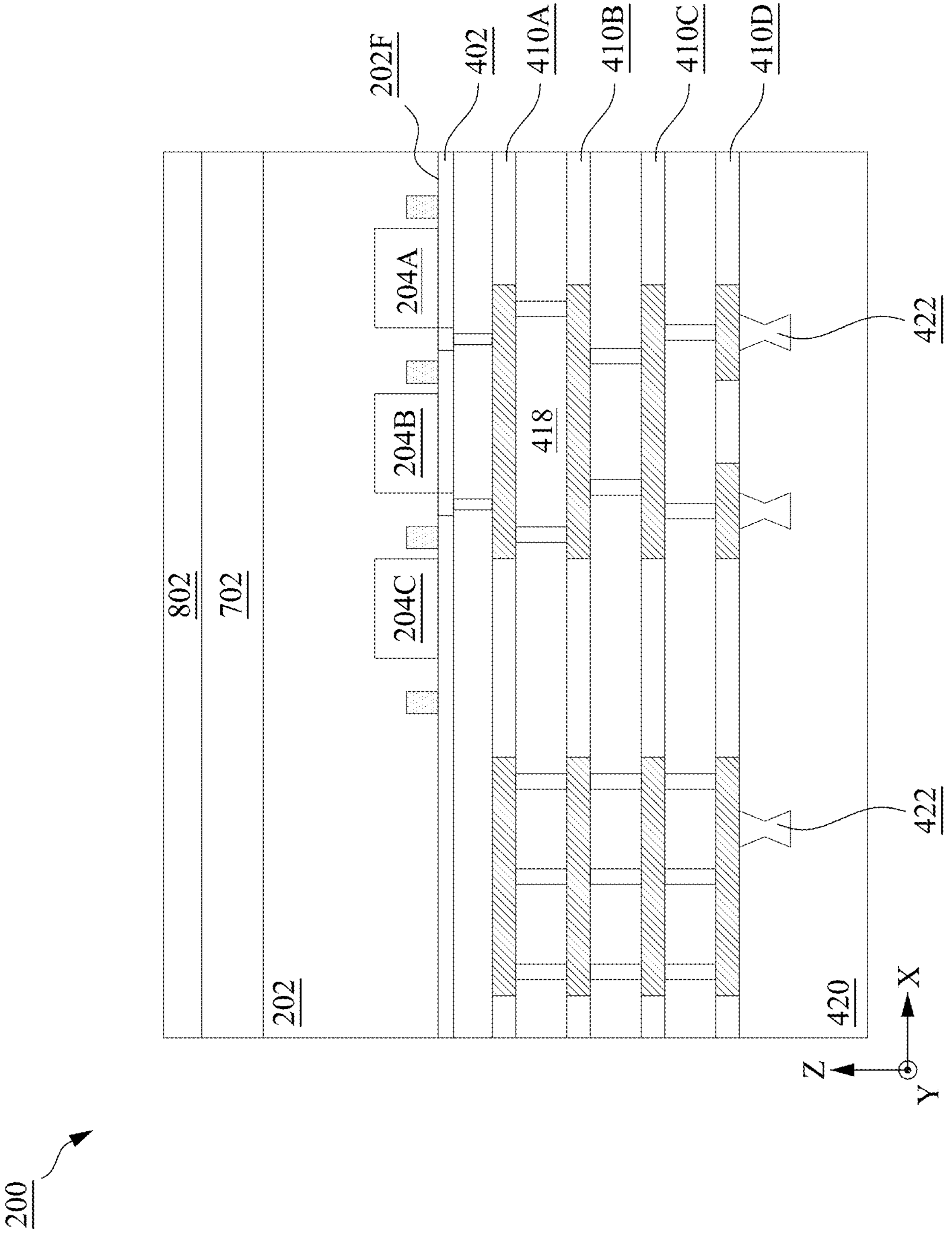

Corresponding to operation 112 of FIG. 2, FIG. 9 is a cross-sectional view of the BSI image sensor device 200 including a second dielectric layer 802 at one of the various stages of fabrication. The second dielectric layer 802 may be deposited over the back side of the substrate over the first dielectric layer 702. The second dielectric layer 802 may be a single layer or a multi-layered structure. In cases where the first dielectric layer 702 is set, the second dielectric layer 802 may be used to "tune" the refractive index by selecting a material and thickness to minimize constructive interference caused by the waves of light passing through first dielectric layer 702, the semiconductor substrate, and a color filter layer (e.g., 902 of FIG. 10) to the pixels 204 A-C, thereby reducing petal flare.

In some embodiments, the second dielectric layer 802 is silicon oxide, carbon-doped silicon oxide. A wide variety of materials may be employed in accordance with embodiments, for example, lower dielectric constant materials composed of Si, O, X, N in oxide, nitride, or carbide composite films. Examples of possible second dielectric layer 802 materials include $SiO_2$, SiO, MgO, $Al_2O_3$, $Yb_2O_3$, ZNO, $Si_3N_4$, $Ta_2O_5$, $ZrO_2$, $HFO_2$, $TeO_2$, $TiO_2$. Other examples of possible second dielectric layer 802 materials include $SiO_2$ doped with one or more of $CaF_2$, B, Ba, and P. Other examples of possible first dielectric layer 702 materials and second dielectric layer 802 materials are various chemical structures represented by $Si_xO_y$, $Si_xN_z$, and $Si_xO_yN_z$.

Examples of possible embodiments may include spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the first dielectric layer 802 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer. The thickness of the first dielectric layer 702 may be patterned across the substrate. In some embodiments, the thickness of the first dielectric layer 702 may be selected to cause incident radiation passing through a color filter layer (e.g., 902 of FIG. 10), the first dielectric layer 702 and the second dielectric layer 802 to the pixels 204A-C to have destructive interference.

Figure 10:
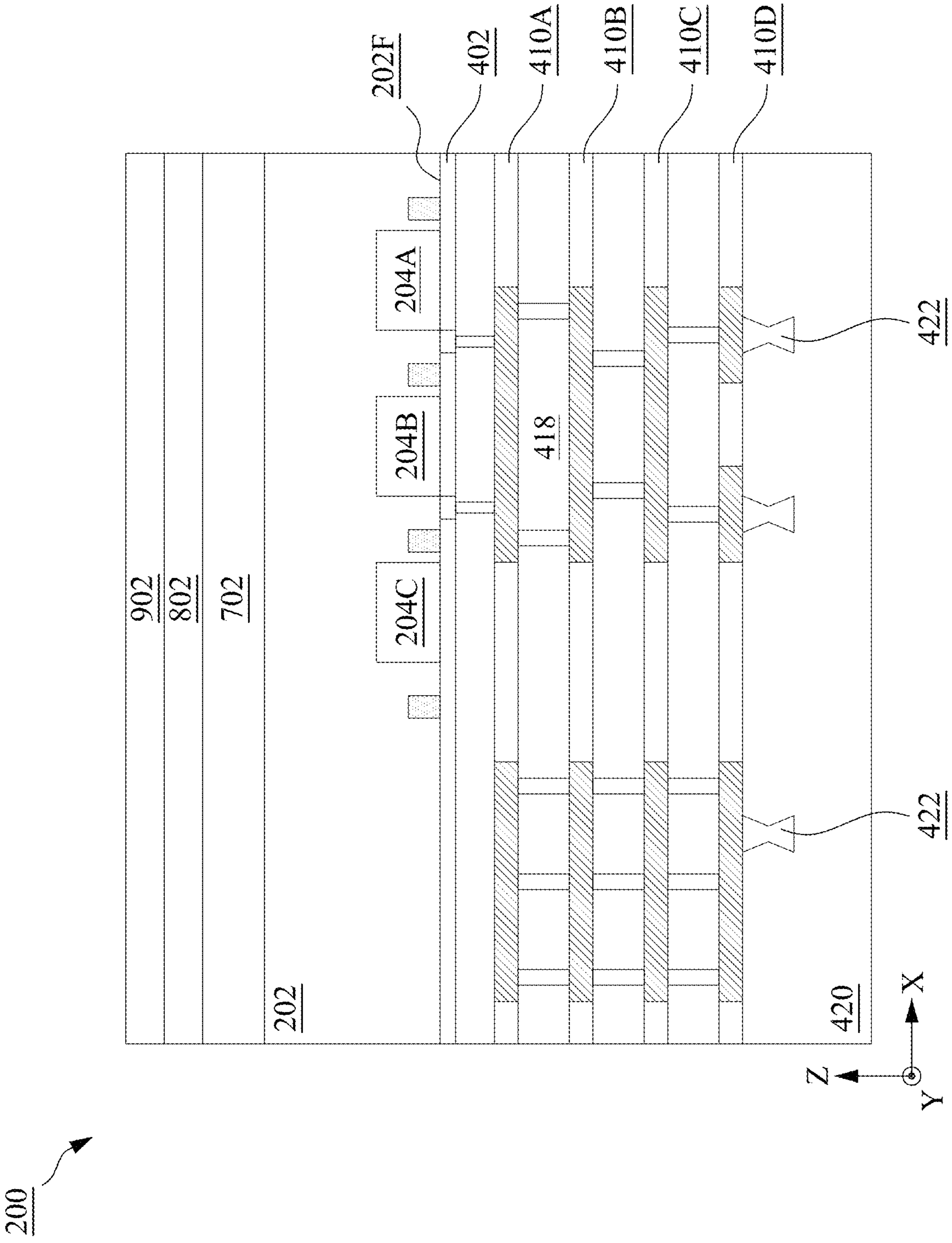

Corresponding to operation 114 of FIG. 2, FIG. 10 is a cross-sectional view of the BSI image sensor device 200 including a color filter layer 902 at one of the various stages of fabrication. Examples of possible materials for the formation of the color filter layer 902 include resin or other organic-based material having color pigments such as dye-based polymers. The color filtering material for the color filter layer 902 can be selected such that light with a desired wavelength passes through the filtering material, while light with other wavelengths is absorbed by the color filtering material. For example, a green light filtering material receiving unfiltered natural light would allow the green light portion (wavelengths between about 495 nm and about 570 nm) to pass through the color filter layer 902, but would absorb all the other wavelengths. The color filter layers 902 may be aligned to respective pixels to provide filtered light to corresponding pixels.

In some instances, the refractive index of the semiconductor substrate is greater than the refractive index of the color filter layer. In some instances, the refractive index of the color filter layer is greater than a refractive index of the first dielectric layer. In some instances, the refractive index of the first dielectric layer is greater than the refractive index of the second dielectric layer. In some instances, the refractive index of the semiconductor substrate is greater than the refractive index of the color filter layer, which is greater than the refractive index of the first dielectric layer, which is greater than the refractive index of the second dielectric layer.

In some instances, the thickness and material of the semiconductor substrate 202 and the color filter layer 902 may be fixed due desired device characteristics. In this case, the material and the thickness of the first dielectric layer 702 and the material and thickness of the second dielectric layer 802 may be used to "tune" the refractive index by selecting a material and thickness to minimize constructive interference caused by the waves of light passing through first dielectric layer 702, the semiconductor substrate 202, and color filter layer 902 to the pixels 204 A-C, thereby reducing petal flare. Once the material is selected for the first dielectric layer 702, the thickness of the first dielectric layer 702 may be calculated using the following relationship:

$$2t_1 = \frac{2m_1 + 1}{2}\left(\frac{\lambda}{n_1}\right)m_1$$

Once the material of the second dielectric layer 802 is selected, the thickness of the second dielectric layer 802 may be calculated using the following relationship:

$$2t_2 = \left(\frac{\lambda}{n_2}\right)m_2,$$

In the relationships, $t_1$ represents the thickness of the first dielectric layer, $t_2$ represents the thickness of the second dielectric layer 802, $\lambda$ is a wavelength of incident light (post the color filter), $n_1$ represents the refractive index of the first dielectric layer 702, $n_2$ represents the refractive index of the second dielectric layer 802 and $m_1$ and $m_2$ are integers. FIGS. 11-14 further explain the underlying principles of the selection of the first dielectric layer 702 and second dielectric layer 802 along with their respective thicknesses.

FIG. 11 illustrate tables of materials and refractive indices (n) for selection of a material for use as a first dielectric layer 702 and a second dielectric layer 802, in accordance with some embodiments. Materials may include, for example, $SiO_2$, SiO, MgO, $Al_2O_3$, $Yb_2O_3$, ZNO, $Ta_2O_5$, $ZrO_2$, $HFO_2$, $TeO_2$, and $TiO_2$. The material used as the first dielectric layer 702 and the second dielectric layer 802 may be collectively determined to cause incident radiation passing through the first dielectric layer and the second dielectric layer to have destructive interference. Destructive interference may be caused by "tuning" the refractive index of the first dielectric layer 702 and the refractive index of the second dielectric layer 802. The material may be selected based on the desired refractive index (n) of the first dielectric layer 702 and the desired refractive index (n) of the second dielectric layer 802.

FIG. 12 illustrates tables of materials and refractive indices for the selection of a material for use as a first dielectric layer and a second dielectric layer, in accordance with some embodiments. The first dielectric layer 702 and second dielectric layer 802 materials may include $SiO_2$ doped with one or more of $CaF_2$, B, Ba, and P. The $SiO_2$ may be doped using, for example, ion implant of atoms such as $CaF_2$, B, Ba, and P. The $SiO_2$ may be doped using, for example, thermal diffusion, by thermally annealing the $SiO_2$ in the presence of $CaF_2$, B, Ba, or P in a carrier gas. As illustrated in FIG. 12, the presence of the dopant shifts the refractive index (n) of the material used as the first dielectric layer 702 or the second dielectric layer 802. The dopant used as the first dielectric layer 702 and/or the second dielectric layer 802 may be collectively determined to cause incident radiation passing through the first dielectric layer and the second dielectric layer to have destructive interference. Destructive interference may be caused by "tuning" the refractive index of the first dielectric layer 702 and the refractive index of the second dielectric layer 802. The presence and identity of the dopant may be selected based on the desired refractive index (n) of the first dielectric layer 702 and the desired refractive index (n) of the second dielectric layer 802.

Figure 13:
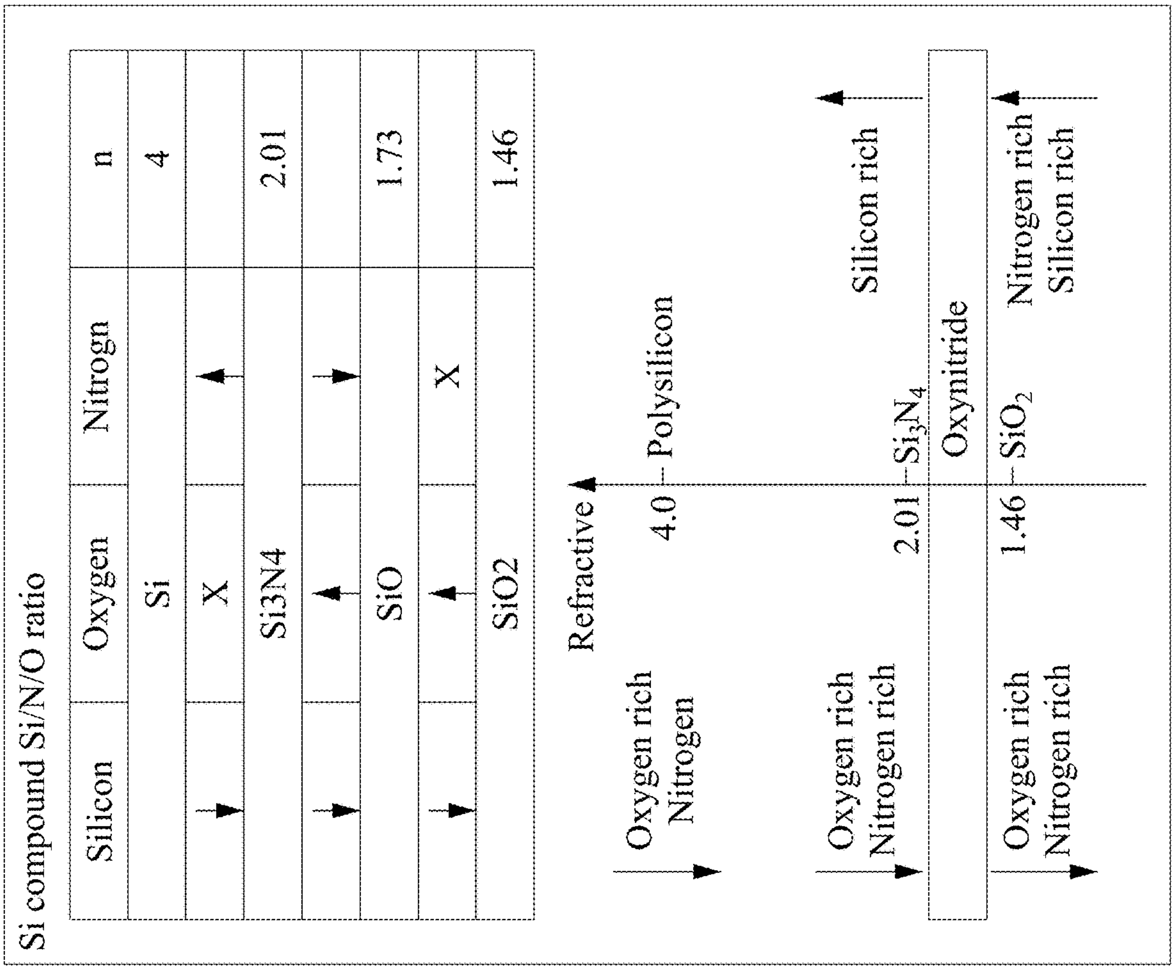

FIG. 13 illustrates tables of materials and refractive indices for selection of a material for use as a first dielectric layer and a second dielectric layer, in accordance with some embodiments. The first dielectric layer 702 materials and second dielectric layer 802 materials may be various chemical structures represented by $Si_xO_y$, $Si_xN_z$, and $Si_xO_yN_z$. As illustrated in FIG. 13, the Si/N/O ratio of the dielectric material may shift the refractive index of the material. For instance, an oxygen rich structure may have a lower refractive index than a pure silicon structure. The ratio of Si/N/O of the first dielectric layer 702 and/or the second dielectric layer 802 may be determined based on the desired refractive index. Additionally, the structure of the dielectric layer, for example crystalline or polysilicon, may shift the refractive index. A polysilicon layer may have a higher refractive index then a crystalline structure. The material used as the first dielectric layer 702 and the second dielectric layer 802 may be collectively determined to cause incident radiation passing through the first dielectric layer and the second dielectric layer to have destructive interference. Destructive interference may be caused by "tuning" the refractive index of the first dielectric layer 702 and the refractive index of the second dielectric layer 802. The material may be selected based on the desired refractive index (n) of the first dielectric layer 702 and the desired refractive index (n) of the second dielectric layer 802.

FIG. 14 illustrates a table of layer thicknesses of the first dielectric layer and the second dielectric correlated with incident light wavelength, in accordance with some embodiments. In order to calculate the thickness of the first dielectric layer and the second dielectric layer, the following relationships can be used.

The thickness of the first dielectric layer 702 may be calculated using the following relationship:

$$2t_1 = \frac{2m_1 + 1}{2}\left(\frac{\lambda}{n_1}\right)m_1$$

The thickness of the second dielectric layer 802 may be calculated using the following relationship:

$$2t_2 = \left(\frac{\lambda}{n_2}\right)m_2,$$

In the relationships, $t_1$ represents the thickness of the first dielectric layer, $t_2$ represents the thickness of the second dielectric layer, $\lambda$ is a wavelength of incident light, $n_1$ represents the refractive index of the first dielectric layer, $n_2$ represents the refractive index of the second dielectric layer and $m_1$ and $m_2$ are integers.

FIG. 14 presents a chart of example wavelengths and correlating thicknesses of the first and second dielectric layers for various integer values of m representing light wave periodicity. The thickness of the first dielectric layer 702 and the second dielectric layer 802 may be collectively determined to cause incident radiation passing through the first dielectric layer 702 and the second dielectric layer 802 to have destructive interference before reaching the pixels and so inhibit petal flare.

In one aspect of the present disclosure, an image sensor device is disclosed. The image sensor device includes a semiconductor layer having a first surface and a second surface, where the second surface is opposite to the first surface. The image sensor device includes a conductive structure disposed over the first surface, with a dielectric layer disposed between the conductive structure and the first surface. The image sensor device includes a first dielectric layer disposed over the second surface of the semiconductor substrate. The image sensor device includes a second dielectric layer disposed over the first dielectric layer. The image sensor device includes a color filter layer disposed over the second dielectric layer. The refractive index of the semiconductor substrate may be greater than a refractive index. The refractive index may be greater than a refractive index of the first dielectric layer. The refractive index of the first dielectric layer may be greater than a refractive index of the second dielectric layer.

In some embodiments, a plurality of radiation sensing regions may be formed over the first surface and configured to receive radiation through the second surface. In some embodiments, a plurality of metallization layers may be disposed on the first surface.

In some embodiments, the second dielectric layer may include $SiO_2$. In some embodiments, the material of the first dielectric layer is selected based on varying a chemical composition of the $SiO_2$. The first dielectric layer may be $SiO_2$ doped with an impurity such as $CaF_2$, B, Ba, and P. The material of the first dielectric layer may be a compound of elements including one or more of Si, N, and O. The material of the first dielectric layer may be a compound such as $Si_3N_4$ and SiO.

In some embodiments, the thickness of the first dielectric layer and the thickness of the second dielectric layer are collectively determined. The thicknesses may be based on the respective refractive indices of the first dielectric layer and the second dielectric layer. The thicknesses may be optimized to cause incident radiation passing through the color filter layer, the first dielectric layer, and the second dielectric layer and on the second surface of the semiconductor substrate to have destructive interference. The first thickness may be determined according to a first relationship:

$$2t_1 = \frac{2m_1+1}{2}\left(\frac{\lambda}{n_1}\right)m_1,$$

and the second thickness may be determined according to a second relationship:

$$2t_2 = \left(\frac{\lambda}{n_2}\right)m_2.$$

In the relationships, $t_1$ represents the thickness of the first dielectric layer, $t_2$ represents the thickness of the second dielectric layer, $\lambda$ is a wavelength of incident light, $n_1$ represents the refractive index of the first dielectric layer, $n_2$ represents the refractive index of the second dielectric layer and $m_1$ and $m_2$ are integers.

In another aspect of the present disclosure, an image sensor device is disclosed. The image sensor device includes a plurality of pixels disposed over a first surface of a semiconductor layer. The image sensor device includes a first dielectric layer disposed over a second surface of the semiconductor substrate. The second surface may be opposite to a first surface. The first dielectric layer may have a first refractive index. A second dielectric layer may be disposed over the first dielectric layer. The second dielectric layer may have a second refractive index. A color filter layer may be disposed over the second dielectric layer. The thickness of the first dielectric layer and the thickness of the second dielectric layer may be collectively determined to cause incident radiation passing through the first dielectric layer and the second dielectric layer and to the plurality of pixels to have destructive interference. The determination may be based on the refractive index of the first dielectric layer and the refractive index of the second dielectric layer.

In some embodiments, the material of the first dielectric layer and the material of the second dielectric layer are collectively selected to cause incident radiation passing through the first dielectric layer and the second dielectric layer to the plurality of pixels to have destructive interference. In some embodiments, the second dielectric layer includes $SiO_2$ and the material of the first dielectric layer is selected based on varying the crystal structure and/or the chemical composition of $Si_xO_y$. In some embodiments, the second dielectric layer includes $SiO_2$ and the material of the first dielectric layer is selected based on varying the crystal structure and/or the chemical composition of $Si_xN_y$. In some embodiments, the material of the first dielectric layer 702 and the material of the second dielectric layer 802 are collectively selected on the basis of a wavelength of incident light.

In some embodiments, the thickness of the first dielectric layer 702 and the thickness of the second dielectric layer 802 are collectively determined based on a refractive index of a material used as the color filter layer to cause incident radiation passing through the color filter layer, the the first dielectric layer, and the second dielectric layer and to the plurality of pixels to have destructive interference. In some embodiments, the thicknesses of the layers is a function of: $t_1$ the thickness of the first dielectric layer, $t_2$ the thickness of the second dielectric layer, $\lambda$ a wavelength of incident light, $n_1$ the refractive index of the first dielectric layer, $n_2$ the refractive index of the second dielectric layer and integers $m_1$ and $m_2$.

In some embodiments, the thickness of the first dielectric layer 702 is determined according to the following relationship:

$$t_1 = \frac{2m_1 + 1}{2}\left(\frac{\lambda}{n_1}\right)m_1$$

In some embodiments, the thickness of the second dielectric layer 802 is determined according to a second relationship:

$$2t_2 = \left(\frac{\lambda}{n_2}\right)m_2,$$

In some embodiments, the first dielectric layer and the second dielectric layer comprise a cap oxide layer. The thickness of the cap oxide layer may be determined according to a third relationship:

$$t_3 = \left(\frac{\lambda}{n_2}\right)m_2 + \frac{2m_1 + 1}{2}\left(\frac{\lambda}{n_1}\right)m_1$$

In yet another aspect of the present disclosure, a method includes forming, over a first surface of a semiconductor layer, a plurality of pixels configured to absorb radiation from a second surface of the semiconductor layer. The second surface of the semiconductor layer is opposite to the first surface of the semiconductor layer. The method includes forming a metallization layer over the first surface of the semiconductor layer. The method includes forming a first dielectric layer over the second surface of the semiconductor substrate. The method includes forming a second dielectric layer over the first dielectric layer. The method includes forming a color filter layer over the second dielectric layer. A refractive index of the semiconductor layer may be greater than a refractive index of the color filter layer. The refractive index of the color filter layer may be greater than a refractive index of the first dielectric layer. The refractive index of the first dielectric layer may be greater than a refractive index of the second dielectric layer. In some embodiments, forming the first dielectric layer includes determining a desired thickness of the first dielectric layer based on a refractive index of the first dielectric layer and a refractive index of the second dielectric layer to cause incident radiation passing through the first dielectric layer and the second dielectric layer and to the plurality of pixels to have destructive interference.

In one aspect of the present disclosure, an image sensor device is disclosed. The image sensor device includes a semiconductor layer having a first surface and a second surface, where the second surface is opposite to the first surface. The image sensor device includes a conductive structure disposed over the first surface, with a dielectric layer disposed between the conductive structure and the first surface. The image sensor device includes a first dielectric layer disposed over the second surface of the semiconductor substrate. The image sensor device includes a second dielectric layer disposed over the first dielectric layer. The image sensor device includes a color filter layer disposed over the second dielectric layer. The refractive index of the semiconductor substrate may be greater than a refractive index. The refractive index may be greater than a refractive index of the first dielectric layer. The refractive index of the first dielectric may be greater than a refractive index of the second dielectric layer.

In another aspect of the present disclosure, an image sensor device is disclosed. The image sensor device includes a plurality of pixels disposed over a first surface of a semiconductor layer. The image sensor device includes a first dielectric layer disposed over a second surface of the semiconductor substrate. The second surface may be opposite to a first surface. The first dielectric layer may have a first refractive index. A second dielectric layer may be disposed over the first dielectric layer. The second dielectric layer may have a second refractive index. A color filter layer may be disposed over the second dielectric layer. The thickness of the first dielectric layer and the thickness of the second dielectric layer may be collectively determined to cause incident radiation passing through the first dielectric layer and the second dielectric layer and to the plurality of pixels to have destructive interference. The determination may be based on the refractive index of the first dielectric layer and the refractive index of the second dielectric layer.

In yet another aspect of the present disclosure, a method includes forming, over a first surface of a semiconductor layer, a plurality of pixels configured to absorb radiation from a second surface of the semiconductor layer. The second surface of the semiconductor layer is opposite to the first surface of the semiconductor layer. The method includes forming a metallization layer over the first surface of the semiconductor layer. The method includes forming a first dielectric layer over the second surface of the semiconductor substrate. The method includes forming a second dielectric layer over the first dielectric layer. The method includes forming a color filter layer over the second dielectric layer. A refractive index of the semiconductor layer may be greater than a refractive index of the color filter layer. The refractive index of the color filter layer may be greater than a refractive index of the first dielectric layer. The refractive index of the first dielectric layer may be greater than a refractive index of the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:

a plurality of pixels disposed in a semiconductor substrate, top surfaces of the plurality of pixels extending along and coplanar with a first surface of the semiconductor substrate;

a first dielectric layer directly contacting a second surface of the semiconductor substrate, the second surface being opposite to the first surface, the first dielectric layer having a first refractive index, and bottom surfaces of the plurality of pixels being separated from the second surface along a vertical direction perpendicular to the second surface;

a second dielectric layer disposed over the first dielectric layer, the second dielectric layer having a second refractive index;

a device layer directly contacting the first surface, the device layer including a semiconductor device; and a color filter layer disposed over the second dielectric layer, wherein a first thickness of the first dielectric layer and a second thickness of the second dielectric layer are collectively determined based on the first refractive index and the second refractive index, resulting in an incident radiation passing through the first dielectric layer and the second dielectric layer and to the plurality of pixels to exhibit destructive interference.

2. The image sensor device of claim 1, wherein a first material of the first dielectric layer and a second material of the second dielectric layer are collectively selected based further on a wavelength of the incident radiation.

3. The image sensor device of claim 1, wherein the second dielectric layer includes $SiO_2$, and wherein the first dielectric layer includes a material selected based on varying at least one of a crystal structure and a chemical composition of $Si_xO_y$, x and y being integers.

4. The image sensor device of claim 1, wherein the second dielectric layer includes $SiO_2$, and wherein the first dielectric layer includes a material selected based on varying at least one of a crystal structure and a chemical composition of $Si_xN_y$, x and y being integers.

5. The image sensor device of claim 1, wherein the second dielectric layer includes $SiO_2$, and wherein the first dielectric layer includes $SiO_2$ doped with at least one impurity selected from $CaF_2$, B, Ba, and P.

6. The image sensor device of claim 1, wherein the first thickness is determined according to a first relationship:

$$2t_1 = \frac{2m_1+1}{2}\left(\frac{\lambda}{n_1}\right)m_1,$$

and wherein the second thickness is determined according to a second relationship:

$$2t_2 = \left(\frac{\lambda}{n_2}\right)m_2,$$

$t_1$ being the first thickness, $t_2$ being the second thickness, $\lambda$ being a wavelength of the incident radiation, $n_1$ being the first refractive index, $n_2$ being the second refractive index, and $m_1$ and $m_2$ being integers.

7. The image sensor device of claim 1, wherein the first dielectric layer and the second dielectric layer comprise a cap oxide layer, and wherein a third thickness of the cap oxide layer is determined according to a third relationship:

$$t_3 = \left(\frac{\lambda}{n_2}\right)m_2 + \frac{2m_1+1}{2}\left(\frac{\lambda}{n_1}\right)m_1,$$

$t_3$ being the third thickness, $\lambda$ being a wavelength of the incident radiation, $n_1$ being the first refractive index, $n_2$ being the second refractive index, and $m_1$ and $m_2$ being integers.

8. The image sensor device of claim 1, wherein the first thickness and the second thickness are collectively determined based on a refractive index of a third material in the color filter layer such that the incident radiation passing through the color filter layer, the first dielectric layer, and the second dielectric layer and to the plurality of pixels exhibits destructive interference.

9. The image sensor device of claim 1, wherein each of the plurality of pixels is configured to absorb the incident radiation through the second surface.

10. An image sensor device, comprising:

a semiconductor substrate including a front surface and a back surface opposite the front surface;

a plurality of pixels disposed over the front surface, the plurality of pixels including top surfaces and bottom surfaces opposite to the top surfaces, the top surfaces of the plurality of pixels being coplanar with the front surface, and the bottom surfaces of the plurality of pixels being vertically separated from the back surface;

a first dielectric layer disposed over the back surface, the first dielectric layer having a first thickness and a first refractive index, a top surface of the first dielectric layer directly contacting the back surface;

a device layer directly contacting the front surface, the device layer including a semiconductor device; and a second dielectric layer disposed over the first dielectric layer, the second dielectric layer having a second thickness and a second refractive index, wherein the first thickness and the second thickness are collectively determined based on at least one of the first refractive index, the second refractive index, and a wavelength of an incident light to reduce constructive interference of the incident light passing through the first dielectric layer and the second dielectric layer.

11. The image sensor device of claim 10, wherein the first thickness is determined according to a first relationship:

$$2t_1 = \frac{2m_1+1}{2}\left(\frac{\lambda}{n_1}\right)m_1,$$

and wherein the second thickness is determined according to a second relationship:

$$2t_2 = \left(\frac{\lambda}{n_2}\right)m_2,$$

$t_1$ being the first thickness, $t_2$ being the second thickness, $\lambda$ being the wavelength of the incident light, $n_1$ being the first refractive index, $n_2$ being the second refractive index, and $m_1$ and $m_2$ being integers.

12. The image sensor device of claim 11, wherein the first dielectric layer and the second dielectric layer comprise a cap oxide layer, and wherein a third thickness of the cap oxide layer is determined according to a third relationship:

$$t_3 = \left(\frac{\lambda}{n_2}\right)m_2 + \frac{2m_1+1}{2}\left(\frac{\lambda}{n_1}\right)m_1,$$

$t_3$ being the third thickness.

13. The image sensor device of claim 10, wherein the first dielectric layer and the second dielectric layer each include at least one material selected from $SiO_2$, SiO, MgO, $Al_2O_3$, $Yb_2O_3$, ZNO, $Si_3N_4$, $Ta_2O_5$, $ZrO_2$, $HFO_2$, $TeO_2$, and $TiO_2$.

14. The image sensor device of claim 10, wherein the first dielectric layer and the second dielectric layer each include $SiO_2$ doped with at least one impurity selected from $CaF_2$, B, Ba, and P.

15. The image sensor device of claim 10, wherein each of the plurality of pixels is configured to absorb the incident light through the back surface.

16. The image sensor device of claim 10, wherein the first thickness and the second thickness are collectively determined such that the incident light passing through the first dielectric layer and the second dielectric layer exhibits destructive interference.

17. The image sensor device of claim 10, further comprising a color filter layer disposed over the second dielectric layer, wherein the first thickness and the second thickness are collectively determined based further on a refractive index of a third material in the color filter layer to reduce the constructive interference of the incident light passing through the color filter layer, the first dielectric layer, and the second dielectric layer.

18. An image sensor device, comprising:
- a semiconductor substrate including a front surface and a back surface opposite to the front surface;
- a plurality of pixels disposed in the semiconductor substrate, top surfaces of the plurality of pixels being coplanar with the front surface;
- an etch stop layer directly contacting the top surface of the plurality of pixels;
- a first dielectric layer directly contacting the back surface, the first dielectric layer having a first thickness and a first refractive index, the first dielectric layer and bottom surfaces of the plurality of pixels being vertically separated by a portion of the semiconductor substrate;
- a second dielectric layer disposed over the first dielectric layer, the second dielectric layer having a second thickness and a second refractive index;
- a device layer directly contacting the front surface, the device layer including a semiconductor device; and
- a color filter layer disposed over the second dielectric layer, wherein the first thickness and the second thickness are collectively determined based on at least one of the first refractive index, the second refractive index, and a wavelength of an incident light to reduce constructive interference of the incident light passing through the first dielectric layer and the second dielectric layer.

19. The image sensor device of claim 18, wherein the first thickness is determined according to a first relationship:

$$2t_1 = \frac{2m_1 + 1}{2}\left(\frac{\lambda}{n_1}\right)m_1,$$

and wherein the second thickness is determined according to a second relationship:

$$2t_2 = \left(\frac{\lambda}{n_2}\right)m_2,$$

$t_1$ being the first thickness, $t_2$ being the second thickness, $\lambda$ being the wavelength of the incident light, $n_1$ being the first refractive index, $n_2$ being the second refractive index, and $m_1$ and $m_2$ being integers.

20. The image sensor device of claim 18, wherein the first dielectric layer and the second dielectric layer each include at least one material selected from $SiO_2$, SiO, MgO, $Al_2O_3$, $Yb_2O_3$, ZNO, $Si_3N_4$, $Ta_2O_5$, $ZrO_2$, $HFO_2$, $TeO_2$, and $TiO_2$.

* * * * *